US012593522B2

(12) United States Patent
Yun et al.

(10) Patent No.: US 12,593,522 B2
(45) Date of Patent: Mar. 31, 2026

(54) BACKSIDE ILLUMINATED IMAGE SENSOR AND MANUFACTURING METHOD THEREOF

(71) Applicant: DB HiTek Co., Ltd., Bucheon-si (KR)

(72) Inventors: Sang Won Yun, Daegu (KR); Ju Hwan Jung, Seoul (KR); Tae Wook Kang, Yongin-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 398 days.

(21) Appl. No.: 18/187,171

(22) Filed: Mar. 21, 2023

(65) Prior Publication Data

US 2024/0120362 A1      Apr. 11, 2024

(30) Foreign Application Priority Data

Oct. 5, 2022    (KR) ........................ 10-2022-0126781

(51) Int. Cl.
| | |
|---|---|
| *H01L 27/146* | (2006.01) |
| *H10F 39/00* | (2025.01) |
| *H10F 39/12* | (2025.01) |
| *H10F 39/18* | (2025.01) |

(52) U.S. Cl.
CPC ....... *H10F 39/8067* (2025.01); *H10F 39/014* (2025.01); *H10F 39/024* (2025.01); *H10F 39/182* (2025.01); *H10F 39/199* (2025.01); *H10F 39/8053* (2025.01); *H10F 39/8057* (2025.01); *H10F 39/8063* (2025.01); *H10F 39/811* (2025.01)

(58) Field of Classification Search
CPC .. H10F 39/8067; H10F 39/014; H10F 39/024; H10F 39/182; H10F 39/199; H10F 39/8053; H10F 39/8057; H10F 39/8063; H10F 39/811; H10F 39/12; H10F 39/802; H10F 39/806; H10F 39/18–1898
See application file for complete search history.

(56) References Cited

U.S. PATENT DOCUMENTS

| | | | |
|---|---|---|---|
| 7,772,624 B2 | 8/2010 | Park | |
| 10,157,948 B2 | 12/2018 | Lee et al. | |
| 2007/0012966 A1 | 1/2007 | Park | |
| 2017/0047367 A1* | 2/2017 | Lee ..................... | H10F 39/8053 |
| 2019/0067357 A1* | 2/2019 | Cheng .................. | H10F 39/811 |
| 2021/0175376 A1 | 6/2021 | Borthakur | |
| 2022/0020790 A1* | 1/2022 | Zang .................. | H10F 39/8063 |
| 2022/0052085 A1* | 2/2022 | Zang ..................... | H10F 39/199 |
| 2022/0344388 A1 | 10/2022 | Ebiko et al. | |

FOREIGN PATENT DOCUMENTS

| | | |
|---|---|---|
| KR | 10-0660549 B1 | 12/2006 |
| KR | 1020170019012 A | 2/2017 |
| KR | 1020220066890 A | 5/2022 |

* cited by examiner

*Primary Examiner* — Cuong B Nguyen
(74) *Attorney, Agent, or Firm* — Central California IP Group, P.C.; Andrew D. Fortney

(57) ABSTRACT

Disclosed are a backside illuminated image sensor and a method of manufacturing the same. More particularly, a backside illuminated image sensor and a method of manufacturing the backside illuminated image sensor include a light scattering portion in a substrate configured to converge a path of incident light to a photoelectric conversion structure, thereby preventing cross-talk between adjacent pixels and increasing light sensitivity.

13 Claims, 16 Drawing Sheets

FIG. 7A          FIG. 7B

BACKSIDE ILLUMINATED IMAGE SENSOR AND MANUFACTURING METHOD THEREOF

CROSS REFERENCE TO RELATED APPLICATION

The present application claims priority to Korean Patent Application No. 10-2022-0126781, filed Oct. 5, 2022, the entire contents of which are incorporated herein for all purposes by this reference.

BACKGROUND OF THE INVENTION

Field of the Invention

The present disclosure relates to a backside illuminated image sensor and a method of manufacturing the same. More particularly, the present disclosure relates to a backside illuminated image sensor and a method of manufacturing the backside illuminated image sensor including a light scattering portion in a substrate configured to converge a path of incident light (e.g., on or in the image sensor) to a photoelectric conversion structure, thereby preventing cross-talk between adjacent pixels and increasing light sensitivity.

Description of the Related Art

An image sensor is a component of an imaging device that generates an image in a cell phone camera or the like. According to its manufacturing process and/or its application, the image sensor may be classified as a Charge Coupled Device (CCD) image sensor or a Complementary Metal Oxide Semiconductor (CMOS) image sensor. The CMOS image sensor is widely used, as general CMOS semiconductor chip manufacturing processes having a high degree of integration, economic feasibility, and ease of connection with surrounding chips can make CMOS image sensors.

A conventional CMOS image sensor includes metal wiring, a color filter, and a lens sequentially stacked on a front surface of a silicon wafer. However, in the image sensor having such a structure, the amount of incident light received by a light receiving element may be reduced due to the metal wiring. Accordingly, a backside illuminated CMOS image sensor (BIS) is being developed, including the wiring on the front surface of the substrate, and the color filter and the lens on the back surface of the substrate. Such a BIS is used in an iris scanner, a Time-Of-Flight (Tof) sensor, and so on, and the importance of increasing light sensitivity in a near infrared range is emerging. However, the light sensitivity of a conventional image sensor in the near infrared range is generally not sufficient for the application field(s) described above.

Accordingly, the present inventor has conceived a new backside illuminated image sensor having an improved structure capable of increasing light sensitivity in the near infrared range, and the detailed description thereof will be described below.

DOCUMENT OF RELATED ART

Korean Patent No. 10-0660549, entitled "IMAGE SENSOR AND METHOD OF MANUFACTURING THE SAME."

SUMMARY OF THE INVENTION

Accordingly, the present disclosure has been made keeping in mind the above problems occurring in the related art, and an objective of the present disclosure is to provide a backside illuminated image sensor and a method of manufacturing the backside illuminated image sensor including a light scattering portion in a substrate configured to converge a path of incident light to a photoelectric conversion structure, thereby preventing cross-talk between adjacent pixels and increasing light sensitivity.

In addition, another objective of the present disclosure is to provide a backside illuminated image sensor and a method of manufacturing the backside illuminated image sensor including a light scattering portion having a relatively deep side section and a relatively shallow center section in the substrate configured to converge a path of (or to focus) incident light to a photoelectric conversion structure, thereby preventing cross-talk between adjacent pixels.

In addition, still another objective of the present disclosure is to provide a backside illuminated image sensor and a method of manufacturing the backside illuminated image sensor including a first side section relatively distant from the center section having a depth greater than a second side section nearer to the center section in the unit pixel, thereby preventing cross-talk between the adjacent pixels.

In addition, yet another objective of the present disclosure is to provide a backside illuminated image sensor and a method of manufacturing the backside illuminated image sensor including a light scattering portion that does not have a center section, thereby simplifying the manufacturing process.

In addition, yet another objective of the present disclosure is to provide a backside illuminated image sensor and a method of manufacturing the backside illuminated image sensor including a light scattering portion with different depths in different individual color light channels, thereby forming light paths with different distances.

In addition, yet another objective of the present disclosure is to provide a backside illuminated image sensor and a method of manufacturing the backside illuminated image sensor including an element isolation film that at least partially overlaps a vertical boundary (e.g., of the unit pixel), thereby preventing an increase in the overall size of the backside illuminated image sensor.

The present disclosure may be implemented by one or more embodiments having some or all of the following configurations, to achieve one or more of the above-described objectives.

According to embodiments of the present disclosure, there is provided a backside illuminated image sensor including a substrate having a front surface and a back surface; a photoelectric conversion structure in the substrate; a wiring region including an interlayer insulation film on the front surface of the substrate, and a metal wiring layer (e.g., that includes a metal material such as an elemental metal or a conductive metal alloy) in the interlayer insulation film; an insulation film on the back surface of the substrate; a color filter on the insulation film; a planarization layer on the color filter; a lens on the planarization layer; and a light scattering portion having an upper surface at the back surface of the substrate or adjacent to the back surface and a lower surface in the substrate, wherein the light scattering portion includes a center section having a first depth at a center of a unit pixel; and a side section spaced apart from the center section in a lateral direction in the unit pixel, the side section having a second depth.

In the present disclosure, the second depth may be greater than the first depth.

In the present disclosure, the light scattering portion may comprise a plurality of side sections along first and second lateral directions from the center section.

In the present disclosure, the light scattering portion may comprise a first number of the side sections along the first lateral direction and a second, different number of the side sections along the second lateral direction.

In the present disclosure, the light scattering portion may comprise a first side section adjacent to the center section having a first depth, and a second side section relatively distant from the center section having a second depth less than the first depth.

In the present disclosure, the side section may have at least a first side with a planar shape or a width larger than a width of the center section.

In the present disclosure, the side section has at least a first side with a planar shape or a width larger than a width of the center section, and the side section adjacent to the center section may have a planar shape or a width smaller than a width of the side section relatively distant from the center section.

In the present disclosure, at least one of the plurality of side sections (or a bottom or lowermost surface thereof) may contact the photoelectric conversion structure in the substrate.

According to another embodiment of the present disclosure, there is provided a backside illuminated image sensor including a substrate having a front surface and a back surface; a photoelectric conversion structure in the substrate; a wiring region including an interlayer insulation film on the front surface of the substrate and a metal wiring layer in the interlayer insulation film; and a light scattering portion having an upper surface at the back surface of the substrate or adjacent to the back surface and a lower surface in the substrate, wherein the light scattering portion includes a center section at a center of a unit pixel; and a side section in contact with the center section in the unit pixel, the side section extending in a lateral direction from the center section.

In the present disclosure, the side section may have a bottom or lowermost surface at a depth in the substrate below a bottom or lowermost surface of the center section.

In the present disclosure, the side section may have a depth into the substrate that increases as the side section extends along the lateral direction from the center section.

In the present disclosure, the side section may have a cross-sectional shape having a width that narrows as the side section extends from the back surface to the front surface of the substrate.

In the present disclosure, the backside illuminated image sensor may further include an insulation film on the back surface of the substrate; a color filter on the insulation film; a planarization layer on the color filter; a lens on the planarization layer; and a light shield comprising a metal film in the color filter and at a boundary of the unit pixel.

In the present disclosure, the backside illuminated image sensor may further include a boundary region comprising an isolation film spaced apart from the front surface of the substrate and at the boundary of the unit pixel; and an element isolation film which extends from the front surface of the substrate and which is spaced apart from the back surface.

In the present disclosure, the boundary region may vertically overlap the element isolation film.

According to still another embodiment of the present disclosure, there is provided a backside illuminated image sensor including a substrate having a front surface and a back surface; a photoelectric conversion structure in the substrate; a wiring region including an interlayer insulation film on the front surface of the substrate and a metal wiring layer in the interlayer insulation film; and a light scattering portion having an upper surface at the back surface of the substrate or adjacent to the back surface and a lower surface in the substrate, wherein the light scattering portion includes a side section that scatters incident light at a position spaced apart from a center of a unit pixel.

In the present disclosure, the side section may have a planar shape that does not converge to the center of the unit pixel.

According to yet another embodiment of the present disclosure, there is provided a backside illuminated image sensor including a substrate having a front surface and a back surface; a photoelectric conversion structure within the substrate in an individual unit pixel; a wiring region including an interlayer insulation film on the front surface of the substrate and a metal wiring layer that includes a metal material in the interlayer insulation film; and a light scattering portion in the individual unit pixel, the light scattering portion having an upper surface at the back surface of the substrate or adjacent to the back surface, and a lower surface in the substrate, wherein the light scattering portion includes a side section is spaced apart from a center of the individual unit pixel.

In the present disclosure, at least one of a plurality of unit pixels may have a side section with a shape that is different from shapes of other side sections in other unit pixels.

In the present disclosure, the light scattering portion may further include a center section at a center of a unit pixel, the center section having a depth less than a depth of the side section.

According to the above configurations, the present disclosure has the following effects.

In the present disclosure, since the light scattering portion in the substrate may converge a path of incident light to the photoelectric conversion structure, cross-talk between adjacent pixels may be prevented and light sensitivity may be increased.

In addition, in the present disclosure, when the side section of the light scattering portion has a depth greater than the center section, cross-talk between adjacent pixels may be prevented.

In addition, in the present disclosure, when the side section relatively distant from the center section has a depth greater than the side section adjacent to the center section, cross-talk between the adjacent pixels may be prevented.

In addition, in the present disclosure, when the light scattering portion does not have the center section, the manufacturing process may be simplified.

In addition, in the present disclosure, when the light scattering portion has different depths in different individual color light channels, the distances of the light paths may be different from each other.

In addition, in the present disclosure, when the element isolation film at least partially overlaps the vertical boundary, an increase in the overall size of the backside illuminated image sensor may be prevented.

Meanwhile, though not explicitly mentioned, effects described in the present specification and tentative effects, expected from the technical features of the present specification will be treated as if described in the present specification.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in detail with reference to accompanying drawings. Various changes to the following embodiments are possible and the scope of the present disclosure is not limited to the following embodiments. The patent right of the present disclosure should be defined by the scope and spirit of the present disclosure as recited in the accompanying claims. In addition, embodiments of the present disclosure are intended to fully describe the present disclosure to a person having knowledge in the art to which the present disclosure pertains.

As used in this specification, a singular form may include a plural form unless the context definitely indicates a particular form. Also, the expressions 'comprise' and/or 'comprising' used in this specification neither define the mentioned shapes, numbers, steps, operations, members, elements, and/or groups of these, nor exclude the presence or addition of one or more other different shapes, numbers, steps, operations, members, elements, and/or groups of these, or additions to these.

Hereinafter, when it is described that a component (or a layer) is referred to as being on another component (or another layer), it should be understood that the component may be directly on the other component, or one or more intervening components (or layers) may also be present. In contrast, when it is described that a component is referred to as being directly on to another component, it should be understood that there is (are) no intervening component(s) present. In addition, the terms indicating positions, such as, being located 'on', 'upper', 'lower', 'upper side', 'lower side', 'first side', and 'side surface' are intended to mean a relative position of the components.

Meanwhile, when an embodiment can be implemented differently, steps or operations described in the present specification may be performed in a different way from those described. For example, two consecutive functions or operations may be performed simultaneously, or in reverse order.

Hereinafter, for example, a first-conductivity-type impurity region may refer to a 'P-type' doped region, and a second-conductivity-type impurity region may refer to an 'N-type' doped region. Otherwise, in some cases, a first-conductivity-type impurity region may refer to an 'N-type' doped region and a second-conductivity-type impurity region may refer to a 'P-type' doped region, and there is no limitation.

A backside illuminated image sensor 1 according to the present disclosure includes a pixel P. The pixel P absorbs light incident toward a back surface of a substrate 101 from the outside. The backside illuminated image sensor 1 may include a plurality of unit pixels P1.

Figure 1A:
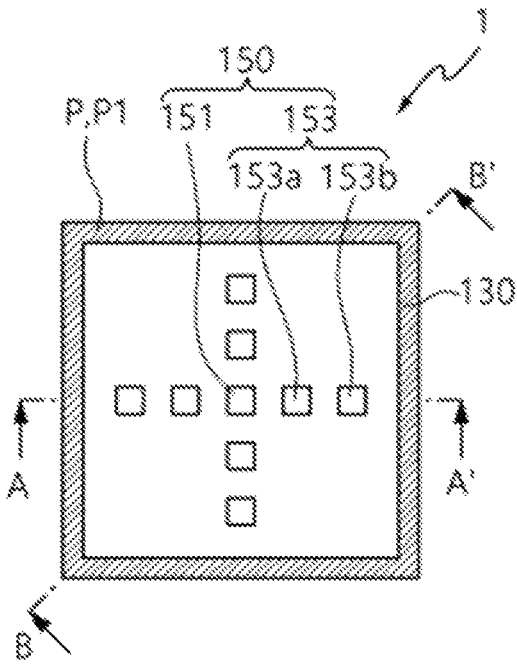
FIGS. 1A to 1D are plan views illustrating a backside illuminated image sensor according to embodiments of the present disclosure.
Figure 1B:
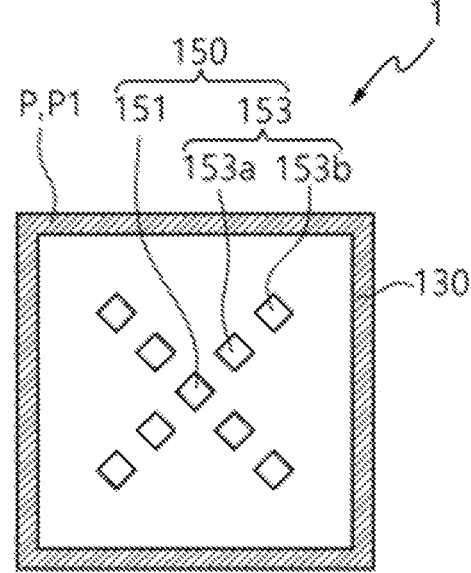
Figure 1C:
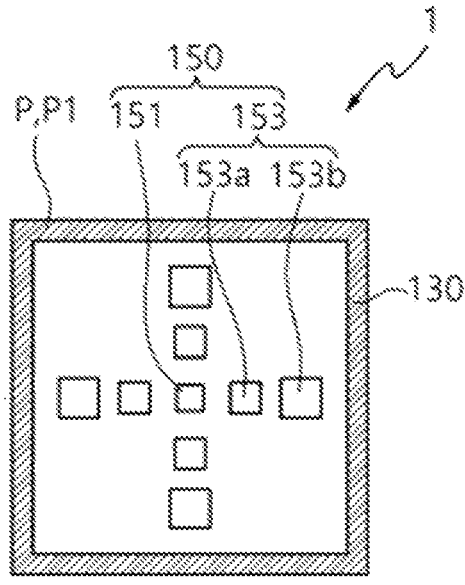
Figure 1D:
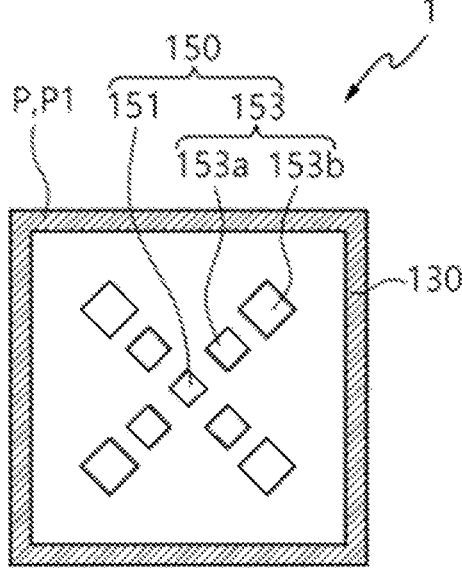
Figures 2A, 2B:
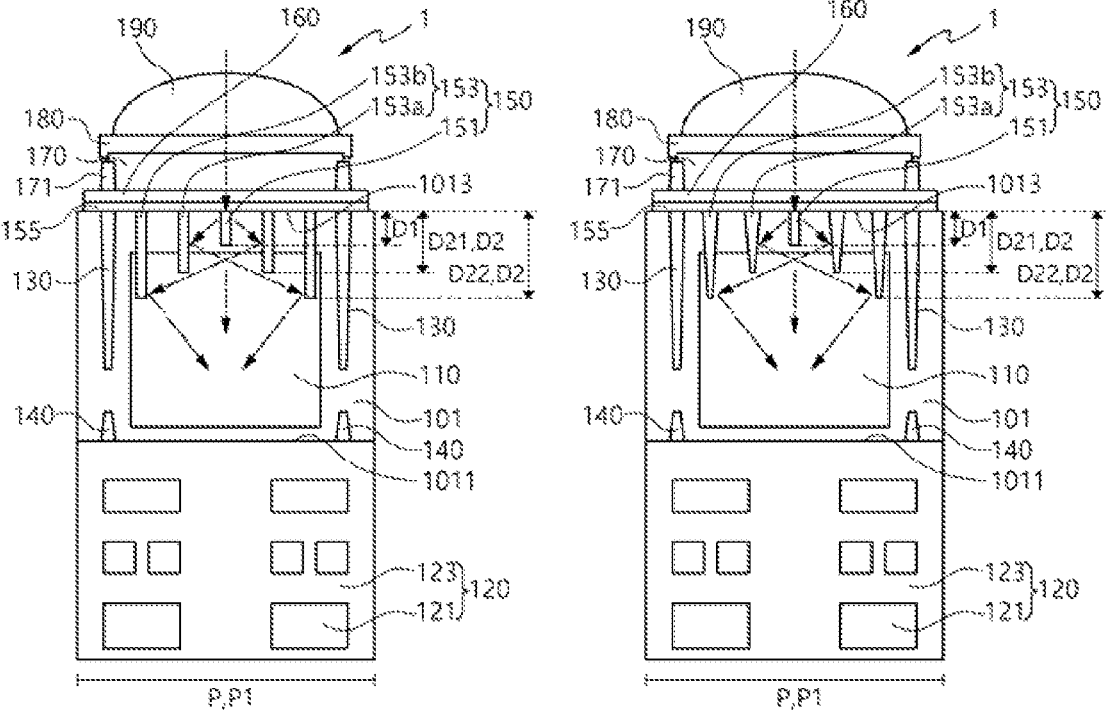
FIGS. 2A and 2B are cross-sectional views illustrating embodiments of the backside illuminated image sensor taken along line A-A' in FIG. 1A.
Figure 3:
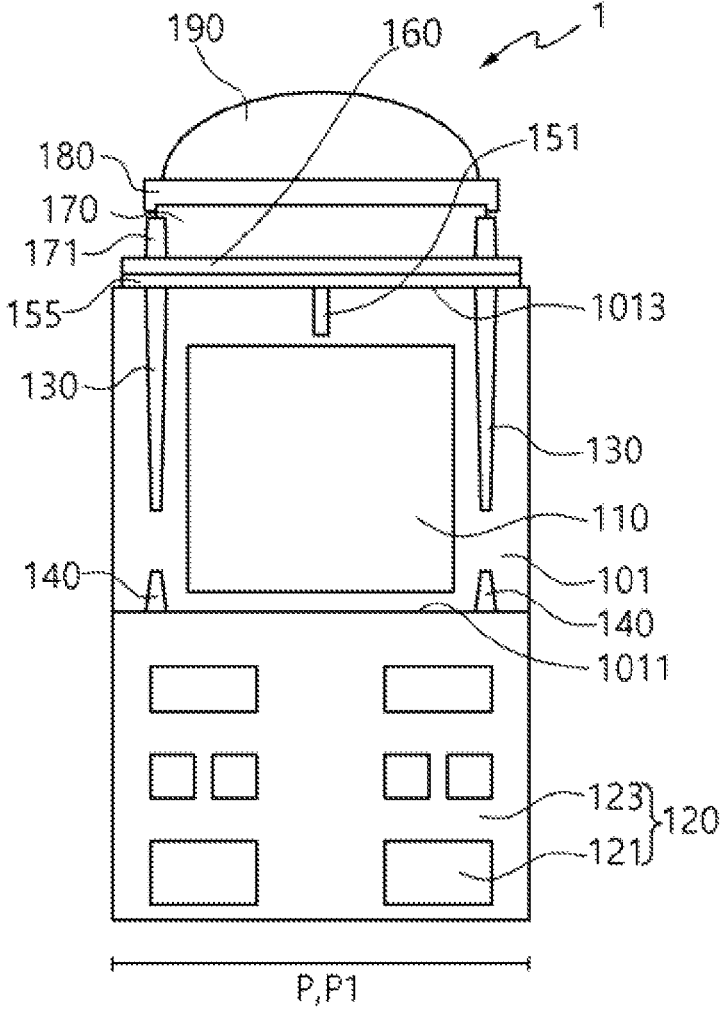
FIG. 3 is a cross-sectional view illustrating the backside illuminated image sensor taken along line B-B' in FIG. 1A.

FIGS. 1A to 1D are plan views illustrating a backside illuminated image sensor according to embodiments of the present disclosure, FIGS. 2A and 2B are cross-sectional views illustrating embodiments of the backside illuminated image sensor taken along line A-A' in FIG. 1A, and FIG. 3 is a cross-sectional view illustrating the backside illuminated image sensor taken along line B-B' in FIG. 1A. For convenience of explanation, in FIGS. 1A to 1D, illustration and/or discussion of a configuration of an upper side of a light scattering portion 140 (e.g., layers above the light scattering portion 140 as shown in FIGS. 2A-3) may be omitted.

Hereinafter, a backside illuminated image sensor 1 according to embodiments of the present disclosure will be described in detail with reference to the accompanying drawings.

Referring to FIGS. 1A to 3, the present disclosure relates to the backside illuminated image sensor 1. More particularly, the present disclosure relates to the backside illuminated image sensor 1 including a light scattering portion in a substrate configured to converge a path of incident light to a photoelectric conversion structure, thereby preventing cross-talk between adjacent pixels P and increasing light sensitivity.

The backside illuminated image sensor 1 may include a substrate 101. For example, the substrate 101 may comprise a single-crystal substrate with an epitaxial layer thereon (e.g., an epitaxial silicon layer on a monolithic silicon wafer), a bulk substrate, or the like, and there is no specific limitation. In addition, the substrate 101 has a front surface 1011 and a back surface 1013. In the drawings, the front surface 1011 is a surface facing a wiring region 120 that will be described later, and the back surface 1013 is a surface facing away from the wiring region 120. The pixel P of the substrate 101 may further include at least one photoelectric conversion structure 110 (e.g., a photodiode) and at least one transistor (not illustrated) electrically connected to the photoelectric conversion structure 110.

The photoelectric conversion structure 110 is configured to generate a charge in response to absorption of incident light. For example, the photoelectric conversion structure 110 may have any known configuration or comprise a known device such as a photodiode, a photo gate, a photo transistor, and so on, and there is no specific limitation. In addition, preferably, the photoelectric conversion structure 110 is in the substrate 101 in each unit pixel P1.

The wiring region 120 may be on the front surface 1011 of the substrate 101. In addition, the wiring region 120 may include a metal wiring layer 121 and an interlayer insulation film 123.

For example, the metal wiring layer 121 may comprise a single metal or an alloy film including at least two types of metals, and may preferably comprise an aluminum (Al) or aluminum alloy film. In addition, in the interlayer insulation film 123, the metal wiring layer 121 may be or comprise a multilayered structure.

For example, the interlayer insulation film 123 may comprise an insulating material such as a silicon dioxide film, and may repeatedly alternate with the metal wiring layer 121 to form a multilayered wiring. Any one metal wiring layer 121 may be connected to an adjacent metal wiring layer 121 by a contact or plug (not illustrated). Using a damascene process, the contact or plug may be formed in the corresponding or overlying interlayer insulation film 123. Furthermore, the contact or plug may comprise a conductive material, selected from, for instance, a polycrystalline silicon film doped with an impurity ion, a metal, an alloy film including at least two types of metals, or a conductive metal nitride, such that the metal wiring layers 121 above and below the contact or plug are electrically connected with each other.

Such an interlayer insulation film 123 may comprise an one or more oxide films selected from a borophosphosilicate glass (BPSG) film, a phosphosilicate glass (PSG) film, a borosilicate glass (BSG) film, an undoped silicate glass (USG) film, a silicon dioxide film formed from tetraethyl orthosilicate (TEOS), or a silicon dioxide film formed using a high-density plasma (HDP), or may comprise a multi-layer film including at least two of the oxide films described above. In addition, after deposition, the interlayer insulation film 123 may be planarized by a CMP process for example.

In addition, a boundary of the individual unit pixel P1 unit may include a boundary region 130 comprising an isolation film in the substrate 101, for preventing cross-talk between adjacent unit pixels P1 and so on. For example, the boundary region 130 may comprise a deep trench isolation (DTI) structure. The boundary region 130 extends from the back surface 1013 of the substrate 101 toward the front surface 1011, and preferably does not extend to the front surface 1011.

In addition, for example, the boundary region 130 may be formed by depositing an oxide (e.g., silicon dioxide) into a trench in the substrate, and there is no specific limitation. The boundary region 130 may be formed by one gap-fill process or at least two gap-fill processes, and there is no limitation. In addition, the boundary region 130 may reflect incident light scattered by a light scattering portion 150 that will be described later back into the pixel P1, toward the photoelectric conversion structure 110.

In the following description, an element isolation film 140 that extends toward the front surface 1011 may be at the back surface 1013 of the substrate 101. For example, the element isolation film 140 may comprise a shallow trench isolation (STI) structure, and may define an active region (e.g., of the unit pixel). In addition, the element isolation film 140 may at least partially and/or vertically overlap the boundary region 130. This configuration may minimize the size of the individual unit pixel P1. In addition, for example, it is preferable that the element isolation film 140 vertically overlaps the boundary region 130, but the element isolation film 140 and the boundary region 130 are not in contact with each other, but there is no specific limitation.

The light scattering portion 150 is in the substrate 101 in each unit pixel P1, and is configured to converge or focus incident light passing through a color filter 170 that will be described later toward the photoelectric conversion structure 110. In addition, for example, the light scattering portion 150 may comprise silicon dioxide, silicon nitride, a single elemental metal, an alloy film including at least two types of metals, polysilicon, a refractory metal nitride, etc., and there is no specific limitation. For example, it is preferable that the light scattering portion 150 comprises the same material as the boundary region 130. Preferably, the backside illuminated image sensor 1 may further comprise a connection region 155 above the light scattering portion 150 and below an insulation film 160 that will be described later, and which may be connected to the boundary region 130.

In some embodiments, the light scattering portion 150 may include a center section 151 at a center of the unit pixel P, P1 in the cross-sectional view, and may include a side section 153 (see FIGS. 1A to 1D) that is spaced apart from the center section 151 toward the outside of the unit pixel P, P1. The side section 153 may have an island shape and be spaced apart from the center section 151 in the plan view. As described above, the center section 151 and the side section 153 may be indirectly connected to each other by the connection region 155 below the insulation film 160.

The center section 151 is at the center of the individual unit pixel P1 in the substrate 101 and extends toward the front surface 1011 from the back surface 1013, and may have a first depth D1.

Referring to FIGS. 2A and 2B, from a position that is spaced apart toward the outside from the center of the individual unit pixel P1 within the substrate 101, the side section 153 extends toward the front surface 1011 from the back surface 1013 of the substrate 101, and may have a second depth D2 different from (e.g., greater than) the first depth D1. In the cross-sectional view, a plurality of the side sections 153 may be along lateral (e.g., left and/or right) directions with respect to the center section 151 (see FIGS. 1A to 1D). Although the scope of the present disclosure is not limited thereto, different numbers of side sections 153 on different sides of the center section 151 in the cross-sectional view may exist. For example, the image sensor 1 may comprise two side sections 153a on a first side of the center section 151 and three right side sections 153b on a second, opposite side of the center section 151.

As such, when multiple side sections 153 are in multiple directions with respect to the center section 151, it is preferable that the multiple side sections 153 relatively distant from the center section 151 have a greater depth in the substrate 101 than the side section(s) 153 adjacent to the center section 151. As illustrated in the drawings, when two side sections 153 on opposite sides of the center section 151 are respectively referred to as a first side section 153a and a second side section 153b, the second side section 153b may have a greater depth than the first side section 153a (D22>D21). Such depths of the center section 151, the first side section 153a, and the second side section 153b may be adjusted by controlling the area of a corresponding opening in the mask pattern (not illustrated) for forming corresponding trenches in the substrate 101. For example, when the second side section 153b has a depth greater than the depth of the first side section 153a, the opening in the mask pattern corresponding to the second side section 153b has a larger area than the opening corresponding to the first side section 153a.

Therefore, light that passes through the color filter 170 and is scattered radially by the center section 151, may converge toward the photoelectric conversion structure 110 by reflection(s) from the side sections 153.

In addition, the side section 153 may have a depth greater than an uppermost surface of the photoelectric conversion structure 110, or it may not contact the photoelectric conversion structure 110, and there is no limitation. In addition, each center section 151 and each side section 153 may have substantially rectangular cross-sectional shapes (see FIG.

2A) similar to the boundary region 130, may have shapes that gradually narrow or widths that gradually decrease as a function of depth, or may have inverted triangular shapes (see FIG. 2B), and there is no limitation. In the example described above, the center section 151 and the side section 153 may have an inverted triangular shape as a result of using a wet etching process. That is, the center section 151 and the side section 153 may have inverted triangular shapes.

In addition, referring to FIGS. 1A to 1D, the center section 151 may have substantially the same width (e.g., within an error range or margin) in the plan view as the side section 153 (see FIG. 1A and FIG. 1B), or the center section 151 may have a smaller width than the side section 153 (see FIG. 1C and FIG. 1D). In addition, when there are multiple side sections 153 along the same lateral direction in the plan view, the side section(s) 153 farther from the center section 151 may have a width that is larger than the width of the side section 153 adjacent to the center section 151. For example, the second side section 153b may have a width greater than that of the first side section 153a.

In addition, different individual unit pixels P1 may have different numbers of side sections 153. As an example, one unit pixel P1 may include four side sections 153 along a first lateral direction, and the adjacent unit pixel P1 may include two side sections 153 along the first lateral direction.

Figure 4A:
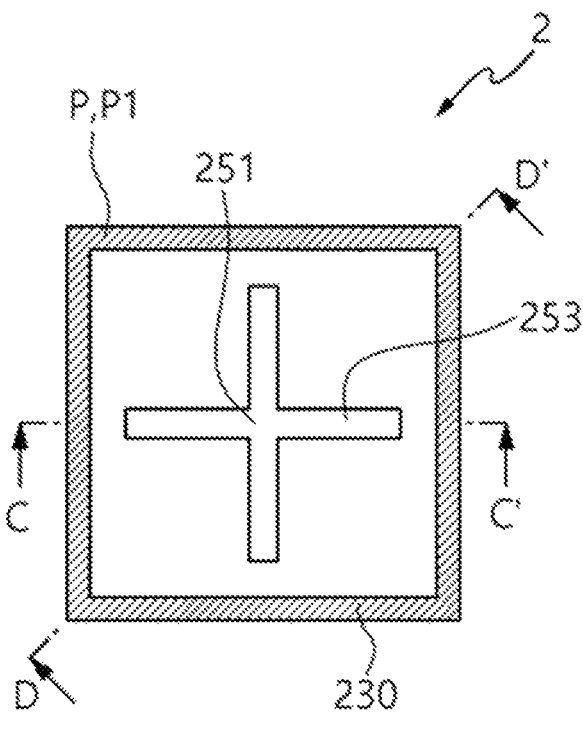
FIGS. 4A to 4D are plan views illustrating the backside illuminated image sensor according to additional embodiments of the present disclosure.
Figure 4B:
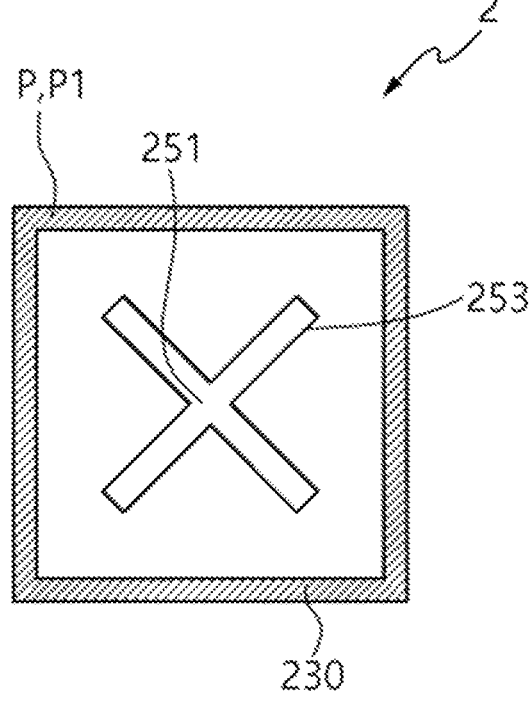
Figure 5:
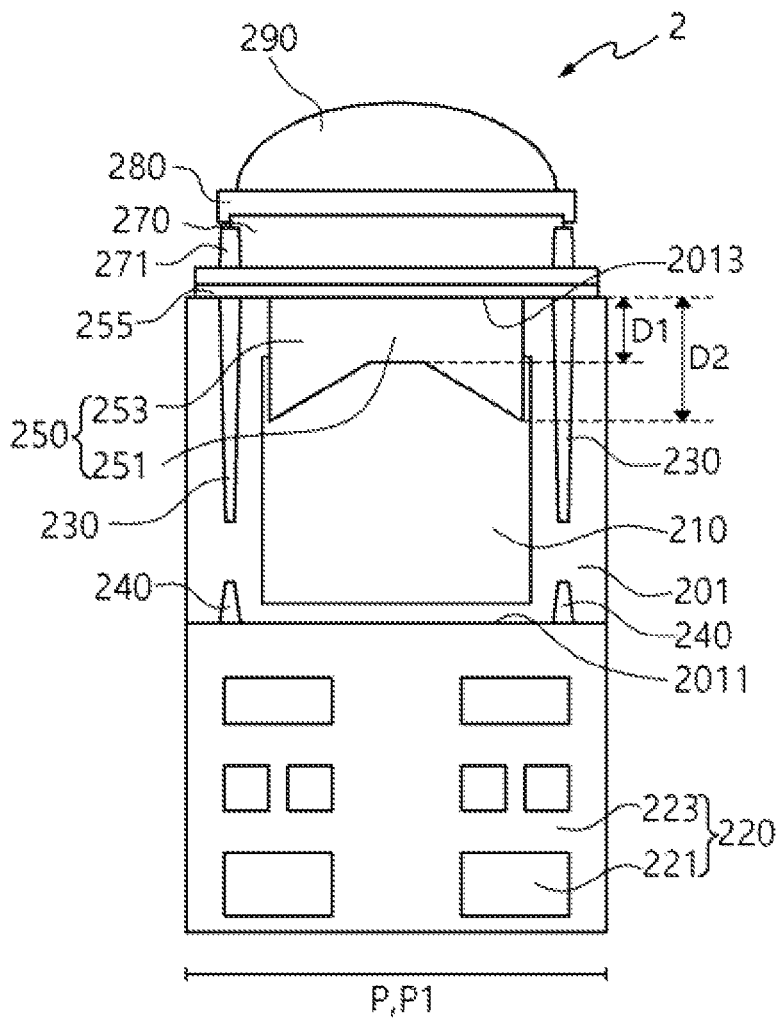
FIG. 5 is a cross-sectional view illustrating the backside illuminated image sensor taken along line C-C' in FIG. 4A.
Figure 6:
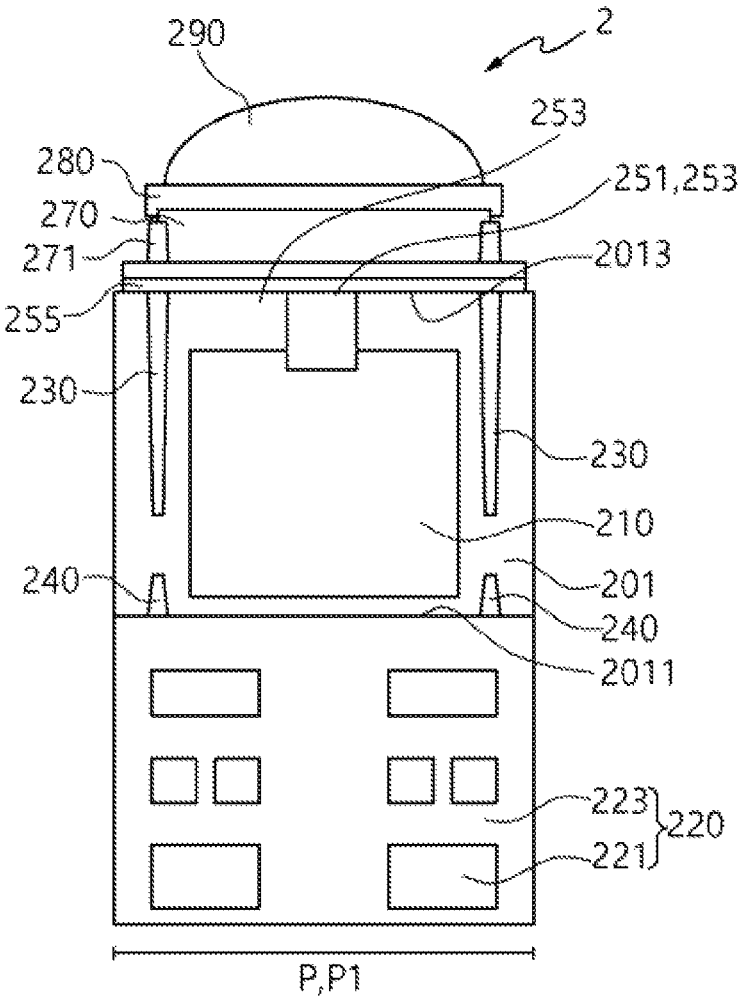
FIG. 6 is a cross-sectional view illustrating the backside illuminated image sensor taken along line D-D' in FIG. 4A.

FIGS. 4A to 4D are plan views illustrating the backside illuminated image sensor according to further embodiments of the present disclosure. FIG. 5 is a cross-sectional view illustrating the backside illuminated image sensor taken along line C-C' in FIG. 4A, and FIG. 6 is a cross-sectional view illustrating the backside illuminated image sensor taken along line D-D' in FIG. 4A. For convenience of explanation, in FIGS. 4A to 4D, illustration of a configuration of an upper side of a light scattering portion 240 may be omitted.

Referring to FIGS. 4A to 6, a center section 251 and a side section 253 of a light scattering portion 250 may be directly connected to each other and may extend along a lateral direction within the substrate 201. That is, a side surface of the center section 251 may be directly connected to the side section 253. It is preferable that the first depth D1 of the center section 251 is less than the second depth D2 of the side section 253. In addition, the side section 253 may have an inclined bottom surface or a depth that increases in steps as the side section 253 extends along the lateral direction away from the center section 251 in the same unit pixel P1.

Figure 4C:
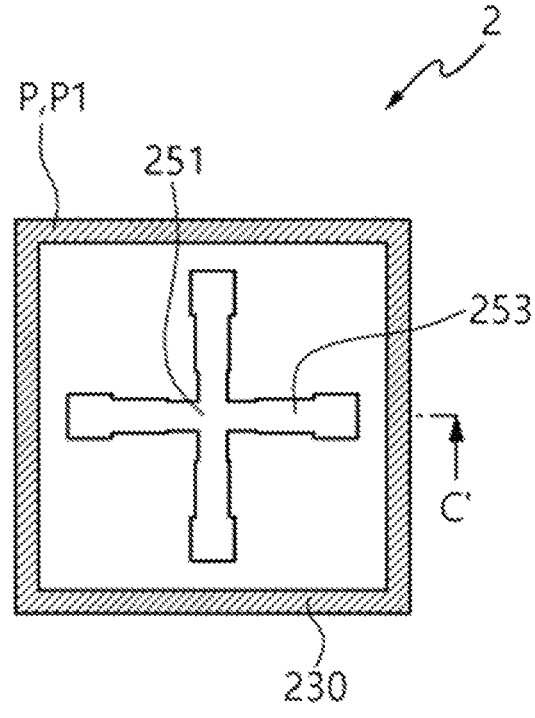
Figure 4D:
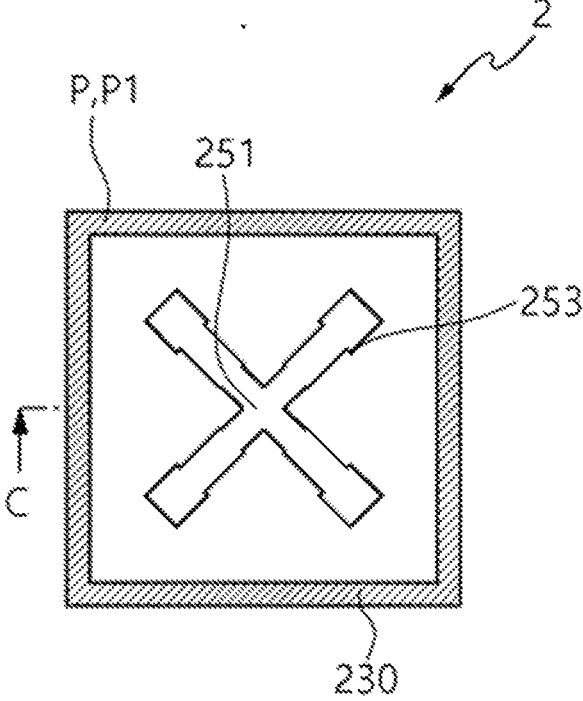

In addition, referring to FIGS. 4A to 4D, the center section 251 and the side section 253 may have uniform widths (e.g., within an error range or margin) as the center section 251 and the side section 253 extend in the lateral direction (see FIG. 4A and FIG. 4B), or the width of the side section 253 may be greater than the width of the center section 251 (see FIG. 4C and FIG. 4D). As the side section 253 extends from the center section 251 within the same unit pixel P1, the side section 253 may have a width that increases continuously or discontinuously (e.g., in a stepwise manner).

In addition, the side section 253 may have a depth greater than an uppermost surface of the photoelectric conversion structure 210, or may not contact the photoelectric conversion structure 210, and there is no limitation. In addition, each center section 251 and each side section 253 may have substantially rectangular cross-sectional shapes similar to the boundary region 230, shapes with widths that gradually narrow as a function of depth into the substrate 101, or inverted triangular shapes having widths that gradually narrow as a function of depth into the substrate 101, and there is no limitation.

Figure 7:
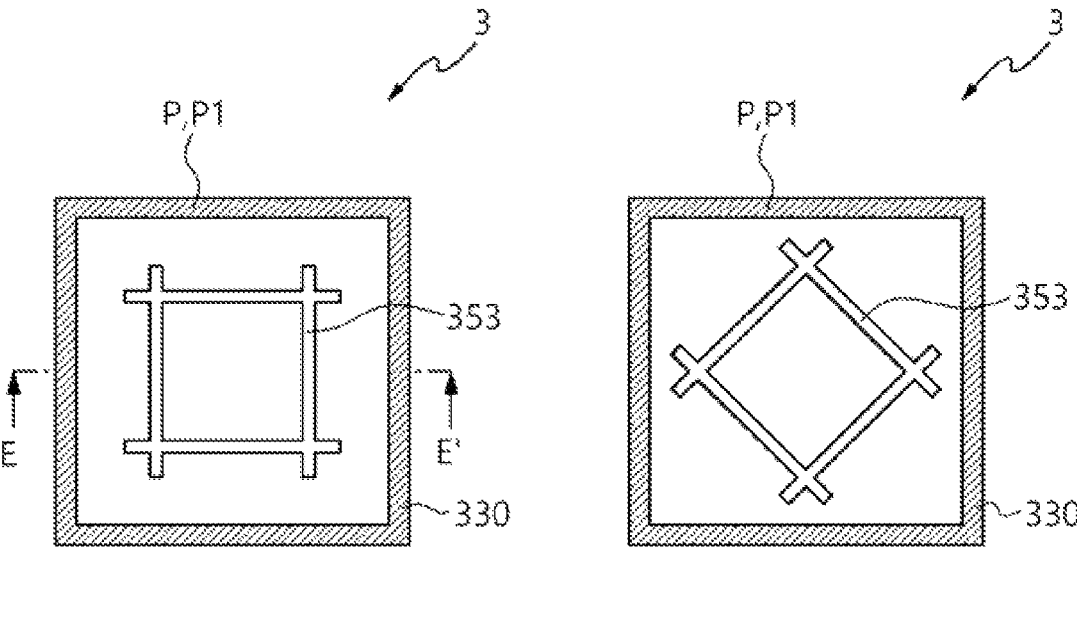
FIGS. 7A and 7B are plan views illustrating the backside illuminated image sensor according to embodiments of the present disclosure.
Figure 8:
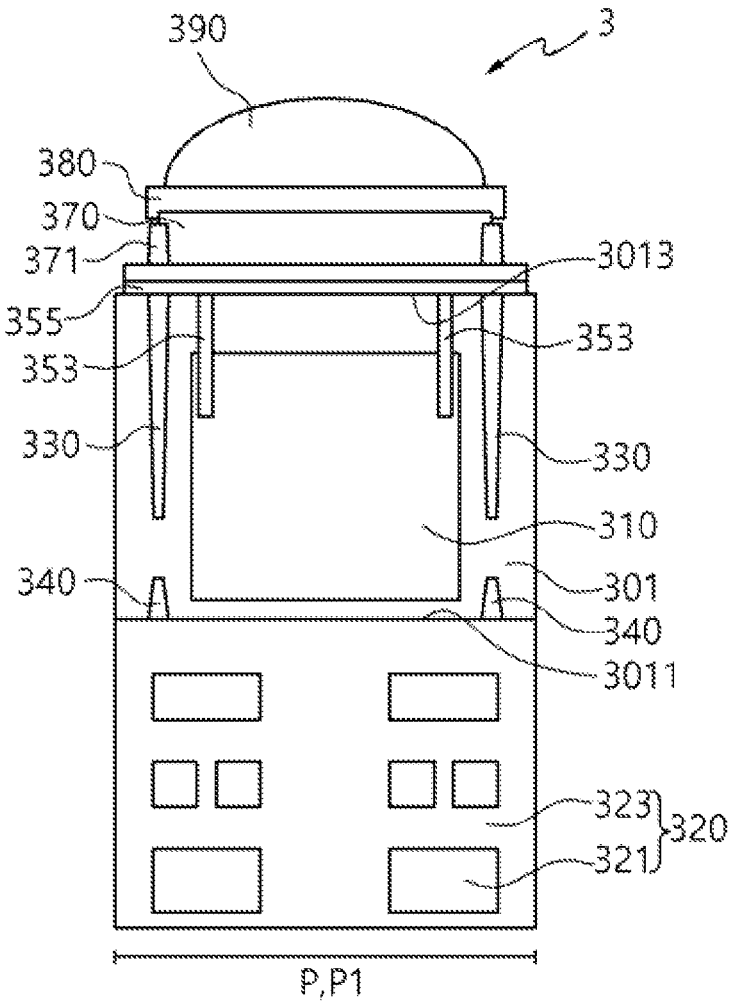
FIG. 8 is a cross-sectional view illustrating the backside illuminated image sensor taken along line E-E' in FIG. 7A.

FIGS. 7A and 7B are plan views illustrating the backside illuminated image sensor according to even further embodiments of the present disclosure, and FIG. 8 is a cross-sectional view illustrating the backside illuminated image sensor taken along line E-E' in FIG. 7A. For convenience of explanation, in FIGS. 7A and 7B, illustration of a configuration of an upper side of a light scattering portion 340 may be omitted.

Referring to FIGS. 7A to 8, the light scattering portion 350 may not have a center section 351. That is, the light scattering portion 350 may comprise only a side section 353. For example, the side section 353 may have a shape that does not converge to or vary as a function of distance from the center of the unit pixel P1. For example, the light scattering portion 350 may have a '#' shape or a '□' shape. The side section 353 may have a substantially continuous second depth D2 or different second depths D2 in different parts thereof, and there is no specific limitation.

In addition, the side section 353 may have a depth greater than the uppermost surface of the photoelectric conversion structure 310, or may not contact the photoelectric conversion structure 310, and there is no limitation. In addition, the side section 353 may have a substantially rectangular cross-sectional shape similar to the boundary region 330, a shape having a width that gradually narrows as a function of depth into the substrate 101, or an inverted triangular shape having a width that gradually narrows as a function of depth into the substrate 101, and there is no limitation.

In summary of the embodiments described above, the light scattering portions 150, 250, and 350 may have a '+' shape, a '#' shape, or a '□' shape, or may have a shape that is not uniform for the individual unit pixel P1, and there is no limitation. For example, an arbitrary unit pixel P1 may have the '□' shape, and an adjacent unit pixel P1 may have the '+' shape. That is, the embodiments described above are applicable simultaneously within one image sensor 1.

In addition, the light scattering portion 150 may have different light path distances in different color light channels (e.g., pixels) by having different depths for each light channel or pixel. For example, the light scattering portion 150 of the unit pixel P1 receiving red light (having the longest wavelength) may extend into the substrate 101 to a depth greater than the light scattering portion 150 of the unit pixel P1 receiving green light. In addition, the light scattering portion 150 of the unit pixel P1 receiving blue light (having the shortest wavelength) may have the shallowest depth. This can be commonly applied to all of the embodiments described above.

In describing the present disclosure again with reference to FIG. 1A to FIG. 3, the insulation film 160 may be on the back surface 1013 of the substrate 101. The insulation film 160 may comprise a silicon dioxide film as an example, but the present disclosure is not limited thereto. Such an insulation film 160 may be on the connection region 155.

The color filter 170 may be on the insulation film 160. The color filter 170 may be configured to allow a predetermined color of light (for example, red light, green light, or blue light) from the lens 190 by a corresponding color filter (red, green, or blue) to pass through the color filter 170, and the selected color of light passes through to the photoelectric conversion structure 110 of the corresponding unit pixel P1. The lens 190 will be described later.

A light shield 171 may be in the color filter 170 at a boundary between adjacent unit pixels P1. The light shield 171 may comprise a metal layer such as tungsten (W) as an example, and is configured to prevent incident light from crossing to the adjacent pixel P1. That is, the light shield 161 is configured to prevent cross-talk between the adjacent pixels P1.

In addition, a planarization layer 180 may be on the color filter 170. The planarization layer 180 may comprise a silicon dioxide film as an example.

The lens 190 is on the planarization layer 180, and the lens 190 may comprise a plurality of micro lenses configured to focus light incident from the back surface 1013 of the substrate 101 to a light receiving element 110 in the unit pixel P1. The color filter 170 and the insulation film 160 may be on or below the planarization layer 180, and the planarization layer 180 may connect the color filter 170 and the insulation film 160 together.

FIGS. 9 to 14 are cross-sectional views illustrating structures formed during a method of manufacturing the backside illuminated image according to one or more embodiments of the present disclosure.

Hereinafter, a method of manufacturing a backside illuminated image sensor according to one or more embodiments of the present disclosure will be described in detail with reference to the accompanying drawings.

Figure 9:
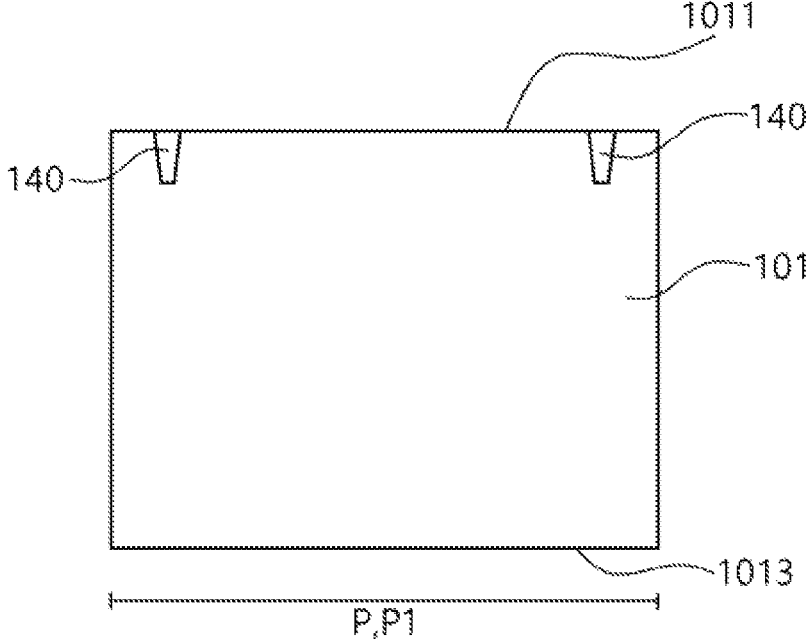
FIGS. 9 to 14 are cross-sectional views illustrating structures formed during a method of manufacturing the backside illuminated image according to one or more embodiments of the present disclosure.

Referring to FIG. 9, the element isolation film 140 is formed in the substrate 101 having the front surface 1011 and the back surface 1013. Such an element isolation film 140 may comprise an STI structure, and may be formed by forming a shallow trench and filling the shallow trench with an insulation film such as silicon dioxide. In addition, the element isolation film 140 may define an active area (e.g., of the unit pixel), and it is preferable that the element isolation film 140 is on a boundary between adjacent unit pixels P1.

Figure 10:
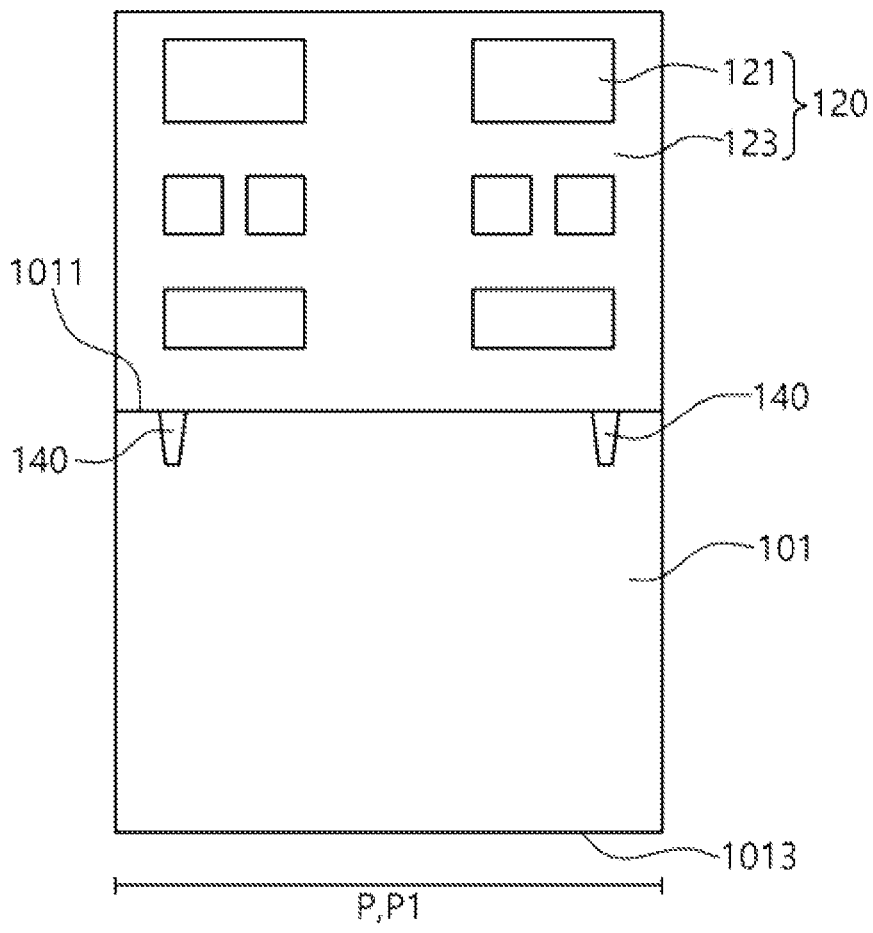

Then, referring to FIG. 10, the wiring region 120 is conventionally formed on the front surface 1011 of the substrate 101. The wiring region 120 includes the metal wiring layer 121 and the interlayer insulation film 123, and the wiring region 120 may be formed by alternatingly forming the interlayer insulation film 123 and the metal wiring layer 121 in a multilayered structure.

Figure 11:
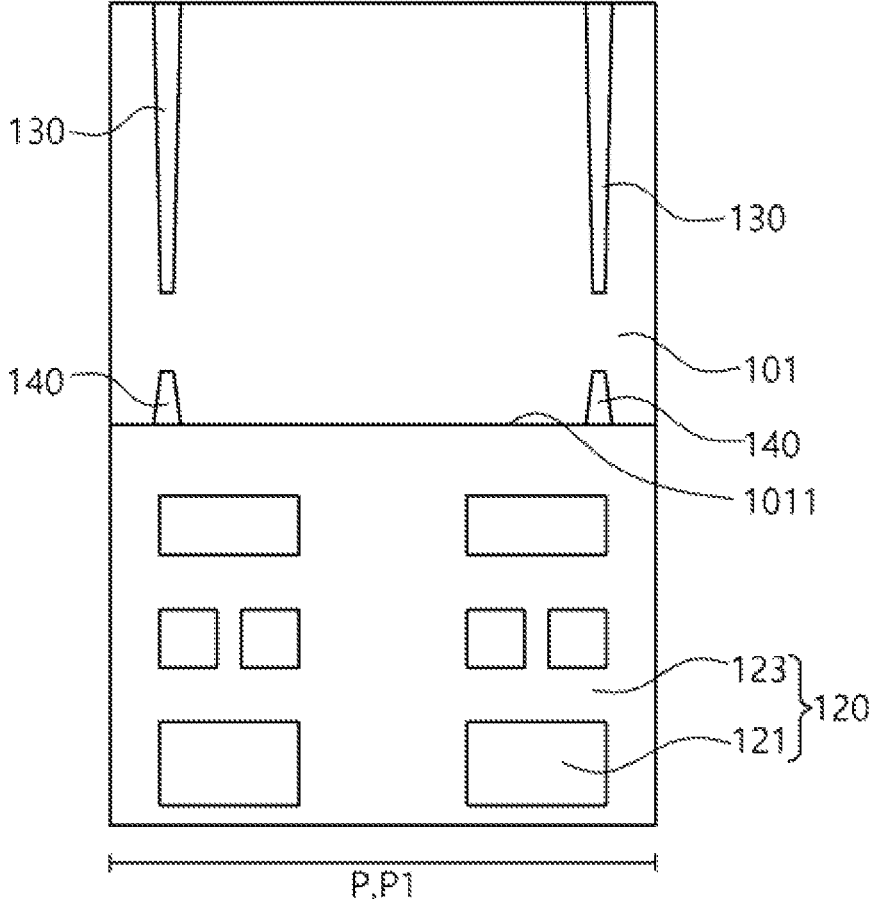

Referring to FIG. 11, after the substrate 101 is turned over so that the back surface 1013 of the substrate 101 faces upward and a thinning process is performed, the boundary region 130 is formed. The boundary region 130 is formed on the boundary between adjacent unit pixels P1, and may have a planar and/or rectangular shape or frame with a mesh structure as an example. For example, the boundary region 130 may comprise a DTI region. After forming a deep trench to a predetermined depth by etching the front surface 1011 of the substrate 101 utilizing a conventionally-formed mask pattern (not illustrated), the boundary region 130 may be formed by depositing an oxide (e.g., silicon dioxide) film, a nitride (e.g., silicon nitride) film, or an oxynitride (e.g., silicon oxynitride) film in the deep trench, and there is no specific limitation. It is preferable that the boundary region 130 extends to a predetermined depth toward the front surface 1011 from the back surface 1013 of the substrate 101 and extends to a depth that does not contact the element isolation film 140.

Figure 12:
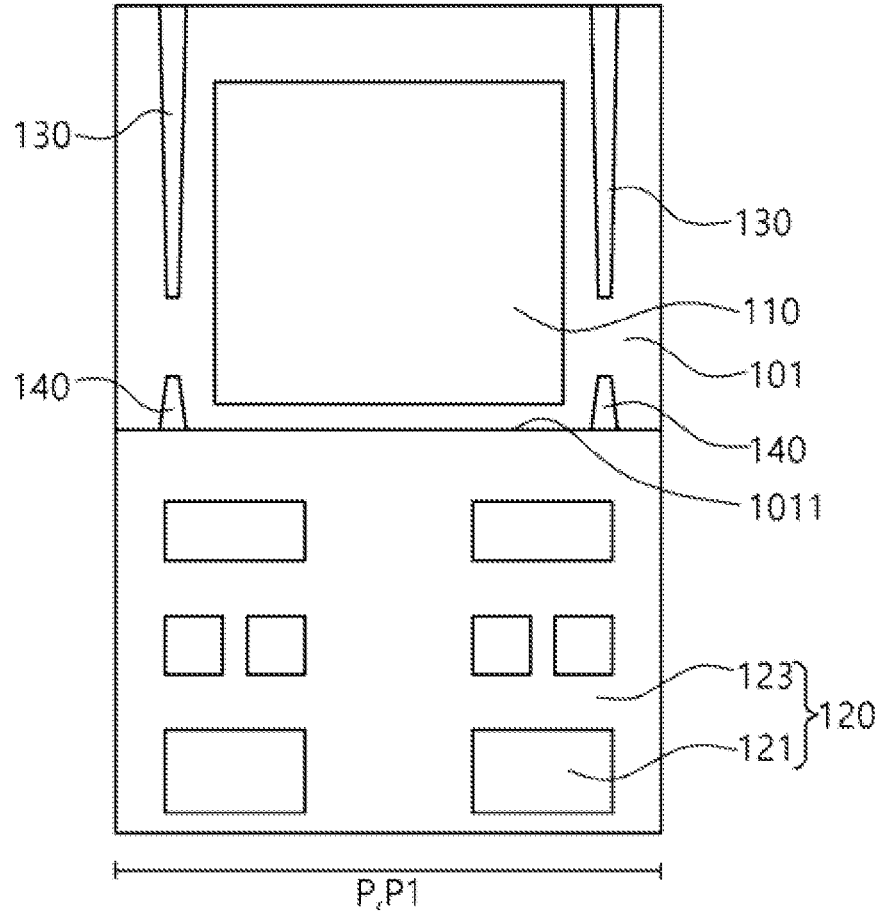

Then, referring to FIG. 12, the photoelectric conversion structure 110 may be formed in the substrate 101 and in the individual unit pixel P1 by conventional ion implantation.

Figure 13:
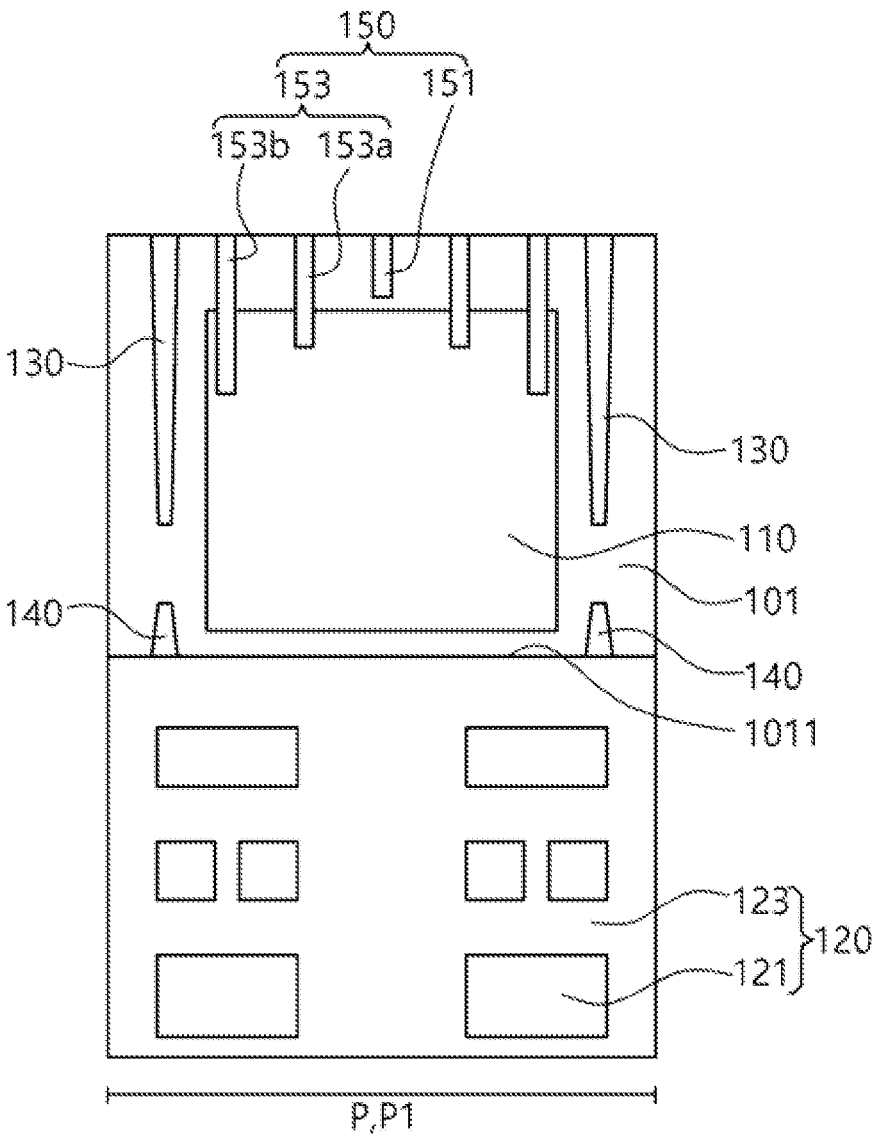

In addition, referring to FIG. 13, the light scattering portions 150, 250, and 350 for each unit pixel P1 are formed such that the light scattering portions 150, 250, and 350 extend to a predetermined depth from the back surface 1013 of the substrate 101. The light scattering portions 150, 250, and 350 may be formed by etching the substrate 101 using a mask pattern (not illustrated) on the back surface 1013 and depositing an insulation film onto the etched substrate. The detailed description thereof will be omitted.

Figure 14:
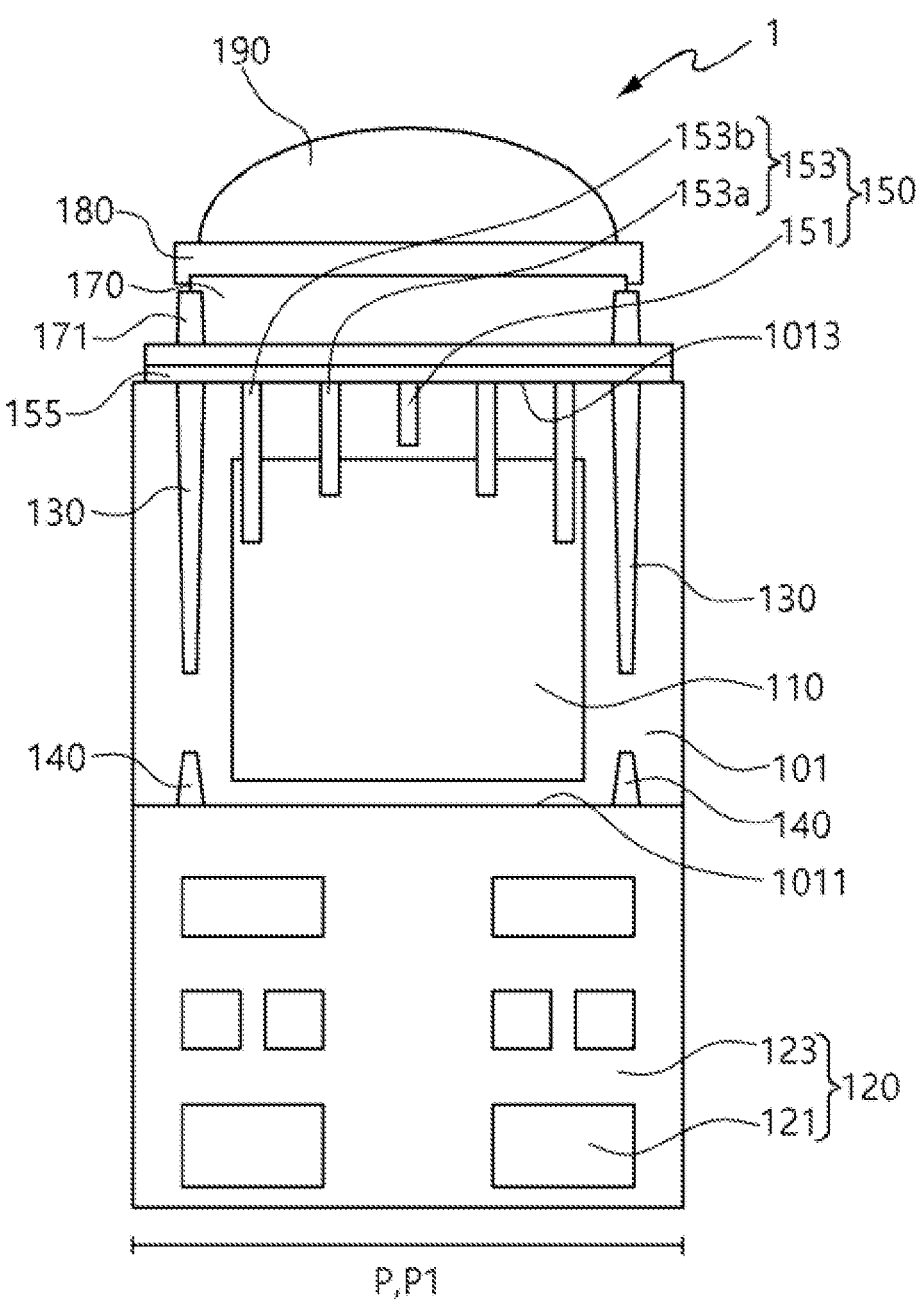

After then, referring to FIG. 14, sequentially, the connection region 155 and the insulation film 160 are conventionally formed on the back surface 1013 of the substrate 101, the color filter 170 is conventionally formed on the insulation film 160, the planarization layer 180 is conventionally formed on the color filter 170, and the lens 190 is conventionally formed on the planarization layer 180.

The foregoing detailed description is for illustrative purposes only. Further, the description provides embodiments of the present disclosure and the present disclosure may be used in other various combination, changes, and environments. That is, the present disclosure may be changed or modified within the scope of the present disclosure described herein, a range equivalent to the description, and/or within the knowledge or technology in the related art. The embodiments may show an optimum state for achieving the spirit of the present disclosure and may be changed in various ways for specific applications and/or fields of use. Therefore, the detailed description of the present disclosure is not intended to limit the present disclosure to the disclosed embodiments.

What is claimed is:

1. A backside illuminated image sensor comprising:
a substrate having a front surface and a back surface;
a photoelectric conversion structure in the substrate, in a unit pixel of the backside illuminated image sensor;
a wiring region comprising an interlayer insulation film on the front surface of the substrate and a metal wiring layer in the interlayer insulation film;
an insulation film on the back surface of the substrate;
a color filter on the insulation film;
a planarization layer on the color filter;
a lens on the planarization layer; and
a light scattering portion having an upper surface at the back surface of the substrate, wherein the light scattering portion comprises:
a center section having a first depth at a center of the unit pixel,
wherein the center section does not contact the photoelectric conversion structure;
and
a plurality of side sections spaced apart from the center section along a lateral direction in the unit pixel, each of the plurality of side sections having a second depth greater than the first depth and a lowermost surface that contacts the photoelectric conversion structure.

2. The backside illuminated image sensor of claim 1, wherein the light scattering portion comprises a first plurality of side sections along a first lateral direction from the center section and a second plurality of side sections along a second lateral direction from the center section, the second lateral direction being opposite from the first lateral direction.

3. The backside illuminated image sensor of claim 1, wherein the plurality of side sections comprises a first number of side sections along a first lateral direction from the center section, and a second number of side sections along a second lateral direction from the center section, the second number being different from the first number, and the second lateral direction being opposite from the first lateral direction.

4. The backside illuminated image sensor of claim 1, wherein each of the plurality of side sections has a width larger than a width of the center section.

5. The backside illuminated image sensor of claim 1, wherein the light scattering portion comprises silicon dioxide, silicon nitride, a single elemental metal, an alloy including at least two types of metals, polysilicon, or a refractory metal nitride.

6. The backside illuminated image sensor of claim 5, wherein a boundary region comprises a same material as the light scattering portion.

7. The backside illuminated image sensor of claim 2, wherein each of the first and second pluralities of side sections comprises a first, outermost side section and a second, inner side section between the first, outermost side section and the center section along a corresponding one of the first and second lateral directions.

8. The backside illuminated image sensor of claim 7, wherein each first, outermost side section is within an area of the photoelectric conversion structure.

9. The backside illuminated image sensor of claim 7, wherein the second, inner side section has a depth less than the first, outermost side section.

10. The backside illuminated image sensor of claim 7, wherein each of the first and second pluralities of side sections has a width larger than a width of the center section, and the second, inner side section has a width smaller than a width of the first, outermost side section.

11. The backside illuminated image sensor of claim 8, wherein each first, outermost side section is adjacent to an outermost peripheral border of the area of the photoelectric conversion structure.

12. The backside illuminated image sensor of claim 7, wherein each of the second, inner side sections has a lowermost surface that contacts the photoelectric conversion structure.

13. The backside illuminated image sensor of claim 1, wherein each of the plurality of side sections is within and adjacent to an outermost peripheral border of the photoelectric conversion structure.

* * * * *